(12) United States Patent
Braun (10) Patent No.: US 10,886,902 B2
(45) Date of Patent: Jan. 5, 2021

(54) SUPERCONDUCTING CIRCUIT AND METHOD FOR DETECTING A RISING EDGE OF AN INPUT SIGNAL

(71) Applicant: Microsoft Technology Licensing, LLC, Redmond, WA (US)

(72) Inventor: Alexander L. Braun, Baltimore, MD (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/210,130

(22) Filed: Dec. 5, 2018

(65) Prior Publication Data

US 2020/0186132 A1 Jun. 11, 2020

(51) Int. Cl.
*H03K 3/38* (2006.01)
*H03K 19/195* (2006.01)

(52) U.S. Cl.
CPC .............. *H03K 3/38* (2013.01); *H03K 19/195* (2013.01)

(58) Field of Classification Search
CPC .... H03K 3/38; H03K 19/195; H03K 19/1952; H03K 19/1954; H03K 19/1956; H03K 19/1958
See application file for complete search history.

(56) References Cited

U.S. PATENT DOCUMENTS

| | | | |
|---|---|---|---|
| 5,963,351 A | 10/1999 | Kaplounenko et al. | |
| 9,876,505 B1 | 1/2018 | Dai et al. | |
| 9,887,700 B2 | 2/2018 | Carmean et al. | |
| 10,090,841 B1 | 10/2018 | Herr | |
| 10,103,736 B1 | 10/2018 | Powell et al. | |
| 2003/0016069 A1 | 1/2003 | Furuta et al. | |
| 2006/0290553 A1* | 12/2006 | Furuta | H03K 3/38 341/155 |

FOREIGN PATENT DOCUMENTS

| | | |
|---|---|---|
| JP | 4690791 B2 | 6/2011 |
| WO | 2018093545 A1 | 5/2018 |
| WO | 2018203943 A2 | 11/2018 |

OTHER PUBLICATIONS

Przybysz, et al., "Interface Circuits for Chip-to-chip Data Transfer at GHz Rates", In Journal of IEEE Transactions on Applied Superconductivity, vol. 7, Issue 2, Jun. 1997, pp. 2657-2660.

(Continued)

*Primary Examiner* — Diana J. Cheng
(74) *Attorney, Agent, or Firm* — Ranjeev Singh; Singh Law, PLLC (57) ABSTRACT

Superconducting circuits and methods for detecting a rising edge of an input signal are described. An example superconducting circuit includes an input terminal for receiving an input signal comprising both positive pulses and negative pulses. The superconducting circuit further includes a first stage, coupled to the input terminal and a first node, configured to suppress both any backward propagating negative pulses and any forward propagating negative pulses, and allow propagation of any forward propagating positive pulses. The superconducting circuit further includes a second stage, coupled to the first node, configured to store a forward propagating positive pulse and reflect a stored positive pulse back to the first node as a negative pulse such that in response to each rising edge of the input signal a return-to-zero signal comprising both a rising edge and a falling edge is provided as an output at the first node.

20 Claims, 6 Drawing Sheets

(56) References Cited

OTHER PUBLICATIONS

"International Search Report and Written Opinion Issued in PCT Application No. PCT/US2019/063484", dated Feb. 18, 2020, 13 Pages.

* cited by examiner

SUPERCONDUCTING CIRCUIT AND METHOD FOR DETECTING A RISING EDGE OF AN INPUT SIGNAL

BACKGROUND

Semiconductor based integrated circuits used in electronic devices, such as digital processors, include digital circuits based on complimentary metal-oxide semiconductor (CMOS) technology. CMOS technology, however, is reaching its limits in terms of the device size. In addition, power consumption at high clock speeds by digital circuits based on the CMOS technology has increasingly become a limiting factor in high performance digital circuits and systems.

As an example, servers in a data center are increasingly consuming large amounts of power. The consumption of power is partly the result of power loss from the dissipation of energy even when the CMOS circuits are inactive. This is because even when such circuits are inactive, and are not consuming any dynamic power, they still consume power because of the need to maintain the state of CMOS transistors. In addition, because CMOS circuits are powered using DC voltage, there is a certain amount of current leakage even when the CMOS circuits are inactive. Thus, even when such circuits are not processing information, a certain amount of power is wasted not only as a result of the requirement to maintain the state of the CMOS transistors, but also as a result of the current leakage.

An alternative approach to the use of processors and related components, based on CMOS technology, is the use of superconducting logic based circuits.

SUMMARY

In one example, the present disclosure relates to a superconducting circuit comprising an input terminal for receiving an input signal comprising both positive pulses and negative pulses. The superconducting circuit may further include a first stage, coupled to the input terminal and a first node, configured to suppress both any backward propagating negative pulses and any forward propagating negative pulses, and allow propagation of any forward propagating positive pulses. The superconducting circuit may further include a second stage, coupled to the first node, configured to store a forward propagating positive pulse and reflect a stored positive pulse back to the first node as a negative pulse such that in response to each rising edge of the input signal a return-to-zero signal comprising both a rising edge and a falling edge is provided as an output at the first node.

In another aspect, the present disclosure relates to a method of operating a superconducting circuit. The method may include receiving an input signal comprising positive pulses and negative pulses. The method may further include suppressing both any backward propagating negative pulses and any forward propagating negative pulses, and allowing propagation of any forward propagating positive pulses through the superconducting circuit. The method may further include storing a forward propagating positive pulse in the superconducting circuit and reflecting a stored positive pulse as a negative pulse such that that in response to each rising edge of the input signal a return-to-zero signal comprising both a rising edge and a falling edge is provided as an output at the first node.

In yet another aspect, the present disclosure relates to a superconducting circuit comprising an input terminal for receiving an input signal comprising both positive pulses and negative pulses. The superconducting circuit may further include a first stage, coupled to the input terminal and a first node, configured to suppress both any backward propagating negative pulses and any forward propagating negative pulses, and allow propagation of any forward propagating positive pulses. The superconducting circuit may further include a second stage, coupled to the first node, configured to store a forward propagating positive pulse and reflect a stored positive pulse back to the second node as a negative pulse after a selected delay such that that in response to each rising edge of the input signal a return-to-zero signal comprising both a rising edge and a falling edge is provided at the first node. The superconducting circuit may further include a third stage, coupled to the first node and an output terminal, configured to amplify the return-to-zero signal and provide an amplified output signal at the output terminal.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Examples described in this disclosure relate to superconducting circuits and methods detecting a rising edge of an input signal. Certain examples described in this disclosure relate to superconducting circuits and methods for detecting a rising edge in the input signal and in response to each rising edge providing a return-to-zero signal comprising both a rising edge and a falling edge. Such RQL circuits that may act as low-power superconductor logic circuits. Unlike CMOS transistors, the RQL circuits are superconductor circuits that use Josephson junction based devices. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the RQL circuits. As an example, superconductors are materials that can carry a direct electrical current (DC) in the absence of an electric field. Such materials have almost zero resistance at or below their critical temperature. One example superconductor, Niobium, has a critical temperature (Tc) of 9.3 Kelvin. At temperatures below Tc, Niobium is superconductive; however, at temperatures above Tc, it behaves as a normal metal with electrical resistance. Thus, in the SIS type of Josephson junctions, superconductors may be Niobium superconductors and insulators may be $Al_2O_3$ barriers. In SIS type of junctions, when a wave function tunnels through the barrier, a changing phase difference in time in the two superconductors creates a potential difference between the two superconductors. In RQL circuits, in one example, the SIS type of junction may be part of a superconducting loop. When the potential difference between the two superconductors is integrated with respect to time over one cycle of phase change, the magnetic flux through the loop changes by an integer multiple of a single quantum of magnetic flux. The voltage pulse associated with the single quantum of magnetic flux is referred to as a single-flux-quantum (SFQ) pulse. As an example, overdamped Josephson junctions can create individual single-flux-quantum (SFQ) pulses. In RQL circuits, each Josephson junction may be part of one or more superconducting loops. The phase difference across the junction may be modulated by the magnetic flux applied to the loop.

Various RQL circuits including transmission lines can be formed by coupling multiple Josephson junctions by inductors or other components, as needed. SFQ pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line. The RQL circuits may advantageously have zero static power dissipation because of the absence of bias resistors. In addition, the RQL circuits may be powered using alternating current (AC) power, thereby eliminating the ground return current. The AC power supply may also act as a stable clock reference signal for the RQL circuits. In one example, the digital data may be encoded using a pair of positive and negative (reciprocal) SFQ pulses. As an example, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock.

The building blocks of exemplary RQL circuits may include various types of logic gates. Exemplary logic gates include an AND gate, an OR gate, a logical A-and-not-B gate and a logical AND/OR gate. The A-and-not-B gate may have two inputs and one output. An input pulse A may propagate to the output when favorable clock conditions may be present on an output Josephson transmission line (JTL), unless an input pulse B comes first with respect to either input pulse A or the favorable clock conditions on the output JTL. The logical behavior of the gate is based on the reciprocal data encoding mentioned earlier. As an example, a positive pulse changes the internal flux state of the inductive loop, but the trailing negative pulse erases the internal state every clock cycle, which in turn produces combinational logic behavior.

Certain examples described in this disclosure relate to superconducting circuits and methods for detecting a rising edge in the input signal and in response to each rising edge providing a return-to-zero signal comprising both a rising edge and a falling edge. The input signal may be a non-return-to-zero signal and the output may comprise return-to-zero pulse pairs. As an example, return-to-zero pulse pairs may include superconducting phase potential signals or other voltage signals that always return to substantially zero voltage after a higher voltage (e.g., representing a logical "1" value). In contrast, as an example, non-return-to-zero signals may include voltage signals that stay at a higher voltage level than substantially zero-voltage when representing a logical "1" value until a voltage signal representing logical "0" is represented. The example superconducting circuits are implemented in a manner that they are compact and require fewer components. This may advantageously reduce the area required for implementing such superconducting circuits as part of a die comprising such circuits. In addition, example superconducting circuits can receive as an input a signal with an arbitrary duty cycle and yet advantageously provide a return-to-zero pulse pair that is output only in response to the rising edges of the input signal.

Figure 1:
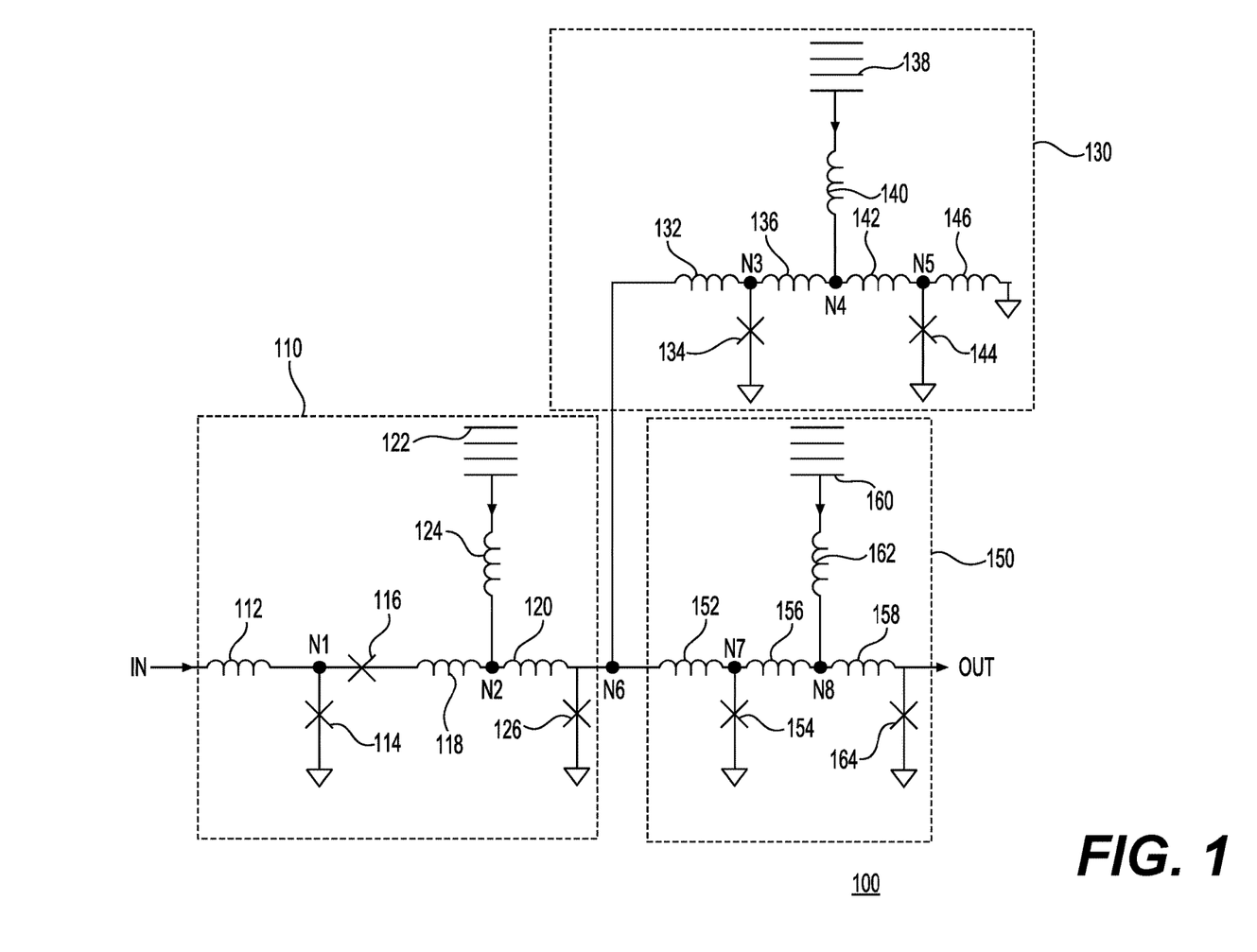
FIG. 1 is a diagram of a superconducting circuit for converting an input signal into a return-to-zero signal in accordance with one example.

FIG. 1 is a diagram of a superconducting circuit 100 for converting an input signal into a return-to-zero signal in accordance with one example. In this example, superconducting circuit 100 may include three stages: stage 110, stage 130, and stage 150. Each of these stages may be implemented as a Josephson transmission line (JTL). All of the JTLs may be biased with AC and DC current using respective bias terminals. The biases may be applied via a transformer to a grounded inductor (not shown) with the DC bias set to $\phi_0/2$. Stage 110 may act as an input stage of superconducting circuit 100. Stage 130 may perform another set of operations (described later) associated with superconducting circuit 100. Stage 150 may act as an output stage of superconducting circuit 100. Stage 110 may include an inductor 112 coupled to receive an input signal via the input terminal IN. The other end of inductor 112 may be coupled to node N1. A Josephson junction (JJ) 114 may be coupled between N1 and the ground terminal. Another JJ 116 may be coupled to one end of an inductor 118 and the other end of the inductor may be coupled to node N2. Node N2 may be coupled to a bias source 122 via an inductor 124. In this example, JJ 116 is biased in an opposite direction from a direction of bias of JJ 114 for pulses arriving via the input terminal IN, JJ 116 is biased in a same direction as the direction of the bias of JJ 114 for pulses arriving via the node N6. Stage 110 may further include an inductor 120 coupled between the node N2 and another node N6. Another JJ 126 may be coupled between node N6 and the ground terminal. In this example stage 110 may be configured to receive a signal including positive and negative single flux quantum (SFQ) pulses and suppress both any backward propagating negative pulses and any forward propagating negative pulses and allow propagation of any forward propagating positive pulses. In this example JJ 116 may prevent backward propagation of negative pulses and may also prevent the generation of more than a single pulse pair as an output in response to a rising edge of a non-return-to-zero (NRZ) signal received via the input terminal IN. Additional details of the operation of stage 110 of superconducting circuit 100 are provided as part of the description of FIG. 2.

Still referring to FIG. 1, stage 130 may be coupled to stage 110 via node N6. In this example, stage 130 is configured to store a forward propagating positive pulse and reverse the positive pulse to produce a negative pulse that can be provided as the negative pulse for the return-to-zero pulse pair. Stage 130 may include an inductor 132 with one end coupled to the node N6 and the other end coupled to node N3. Stage 130 may further include a JJ 134 coupled between the node N3 and the ground terminal. Stage 130 may further include another inductor 136 coupled between the node N3 and node N4. Node N4 may be coupled to a bias source 138 via an inductor 140. Stage 130 may further include an inductor 142 coupled between the node N4 and another node N5. Another JJ 144 may be coupled between the node N5 and the ground terminal. An inductor 146 may be coupled between the node N5 and the ground terminal. In this example, stage 130 may be configured to store a forward propagating positive pulse and reflect a stored positive pulse back to the second node as a negative pulse such that that in response to each rising edge of the input signal a return-to-zero signal comprising both a rising edge and falling edge is provided as an output at node N6. Additional details of the operation of stage 130 of superconducting circuit 100 are provided as part of the description of FIG. 3.

With continued reference to FIG. 1, stage 150 may be coupled to stage 110 and stage 130 via node N6. In this example, stage 150 is configured to drive the output terminal OUT and amplify any signals output via the output terminal OUT. Stage 150 may include an inductor 152 with one end coupled to the node N6 and the other end coupled to node N7. Stage 150 may further include a JJ 154 coupled between the node N7 and the ground terminal. Stage 150 may further include another inductor 156 coupled between the node N7 and node N8. Node N8 may be coupled to a bias source 160 via an inductor 162. Stage 150 may further include an inductor 158 coupled between the node N8 and the output terminal OUT. Another JJ 164 may be coupled between the output terminal OUT and the ground terminal. Although FIG. 1 shows a certain number of components of superconducting circuit 100 arranged in a certain manner, there could be more or fewer number of components arranged differently. As an example, although FIG. 1 shows three separate bias terminals for each of three stages, a single bias terminal may be coupled to each of the three stages. Thus, in this example, the single bias terminal may be coupled to the node N6 via an inductor. As another example, although FIG. 1 shows stage 150 coupled to the output terminal OUT, stage 150 may be replaced by a grounded inductor that is directly coupled to the node N6. In this example, the node N6 will operate as an output terminal for superconducting circuit 100.

Figure 2:
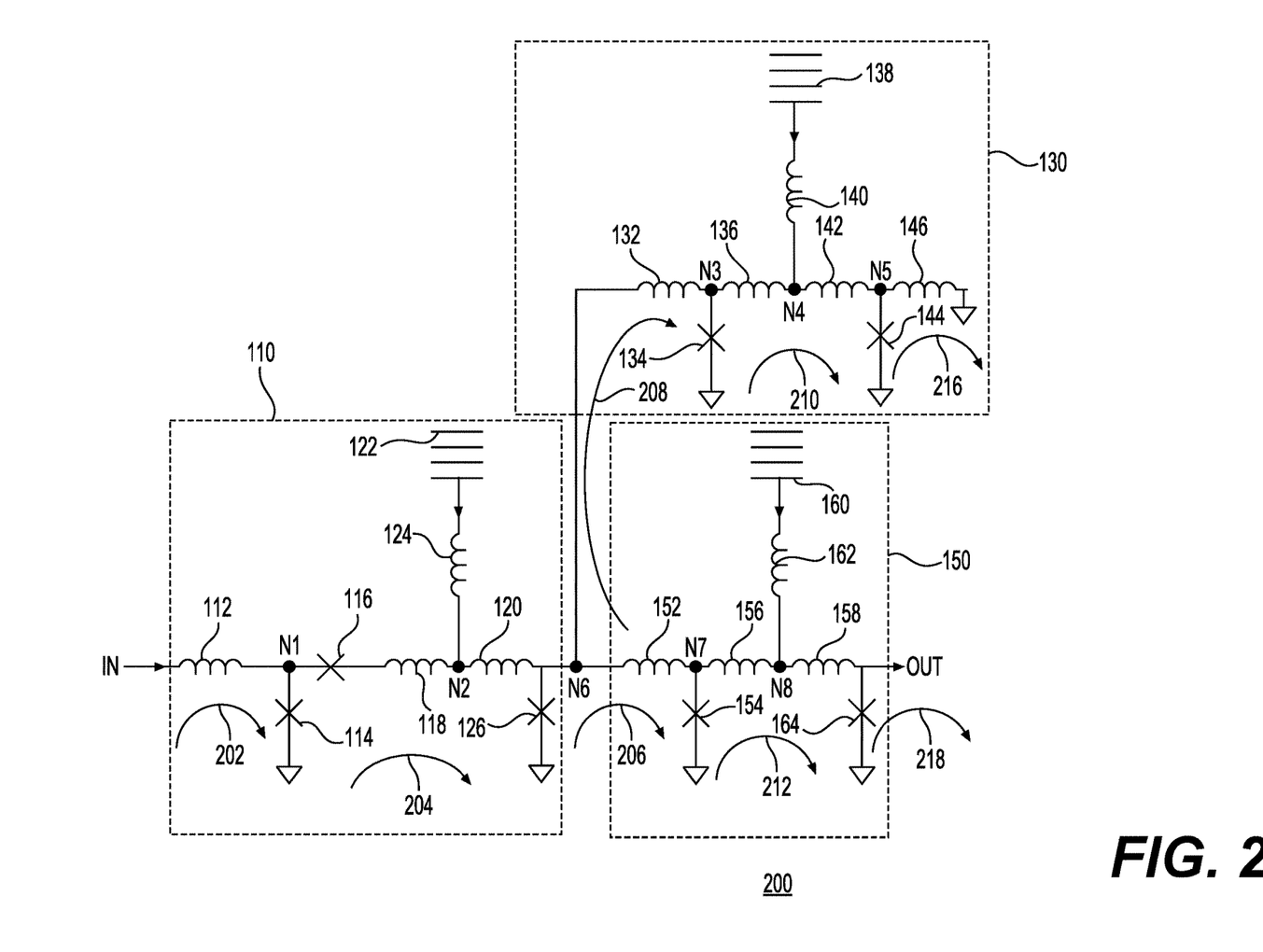
FIG. 2 is a diagram showing an operation state of the superconducting circuit of FIG. 1 in response to a positive pulse arriving at its input in accordance with one example.

FIG. 2 is a diagram showing an operation state 200 of superconducting circuit 100 of FIG. 1 in response to a positive pulse arriving at its input in accordance with one example. When a positive input pulse (curve 202) arrives via the input terminal IN, it propagates through inductor 112 and triggers JJ 114. This results in a positive pulse (e.g., a positive SFQ pulse) (curve 204) being driven towards JJ 126. JJ 116, however, is not triggered because the AC current injected from bias terminal 122 is biasing JJ 116 in the opposite direction from the current applied by the positive input pulse inhibiting the triggering of JJ 116. When JJ 126 triggers, a positive pulse (e.g., a positive SFQ pulse) is driven into both stage 130 and stage 150. With respect to stage 130, the positive pulse (curve 208) triggers JJ 134, driving a positive pulse (curve 210) to JJ 144. That positive pulse is driven further when JJ 144 triggers and the resulting positive pulse (curve 216) is stored in the loop formed by JJ 144 and inductor 146. Regarding stage 150, the positive pulse (curve 206) triggers JJ 154, which in turn drives the positive pulse (curve 212) to JJ 164. JJ 164 triggers in response driving the positive pulse (curve 218) via the output terminal OUT. In this example, this positive pulse represents the rising edge of the return-to-zero pulse.

Figure 3:
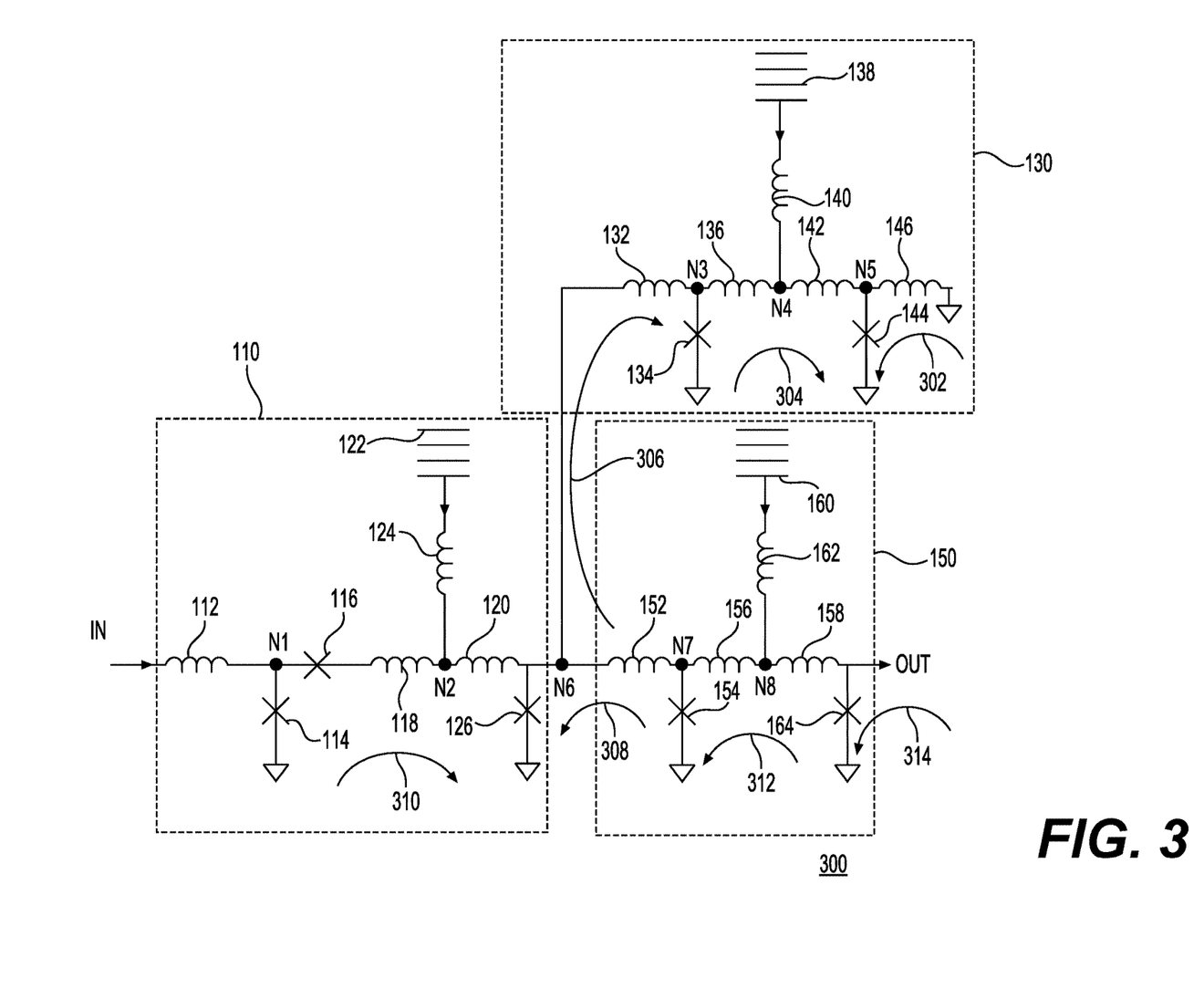
FIG. 3 is a diagram showing an operation state of the superconducting circuit of FIG. 1 after the arrival of the positive pulse but before the arrival of a negative pulse at its input in accordance with one example.

FIG. 3 is a diagram showing an operation state 300 of the superconducting circuit of FIG. 1 after the arrival of the positive pulse but before the arrival of a negative pulse at its input in accordance with one example. This example describes the operation in the context of the reversal of the AC bias currents approximately one-half AC clock cycle later. In operation state 300, the positive pulse (e.g., the positive SFQ pulse) that was shown as travelling rightward is now shown as a negative pulse (e.g., a negative SFQ pulse) travelling leftward. As a result of the negative pulse (curve 302) JJ 144 triggers negatively resulting in negative pulse (curve 304). That negative pulse triggers JJ 134 resulting in leftward movement of negative pulse (curve 306). The negative pulse triggers JJ 126, which generates two negative pulses, one (curve 310) moving leftward (heading towards the input terminal IN) and the other (curve 308) moving rightward (heading towards the output terminal OUT). This time, in this example, JJ 116 triggers, preventing any leftward propagation, because for a pulse traveling leftward, the SFQ current and the AC bias current are additive. The negative pulse traveling rightward triggers JJ 154 continuing the movement of the negative pulse rightward (curve 312), which in turn triggers JJ 164 resulting in the production of a negative pulse (curve 314) at the output terminal OUT. The negative pulse output one-half of an AC clock cycle later provides the negative edge of the return-to-zero signal produced at the output terminal OUT. In this example, superconducting circuit 100 stays in this state until a negative pulse arrives at the input terminal IN.

Figure 4:
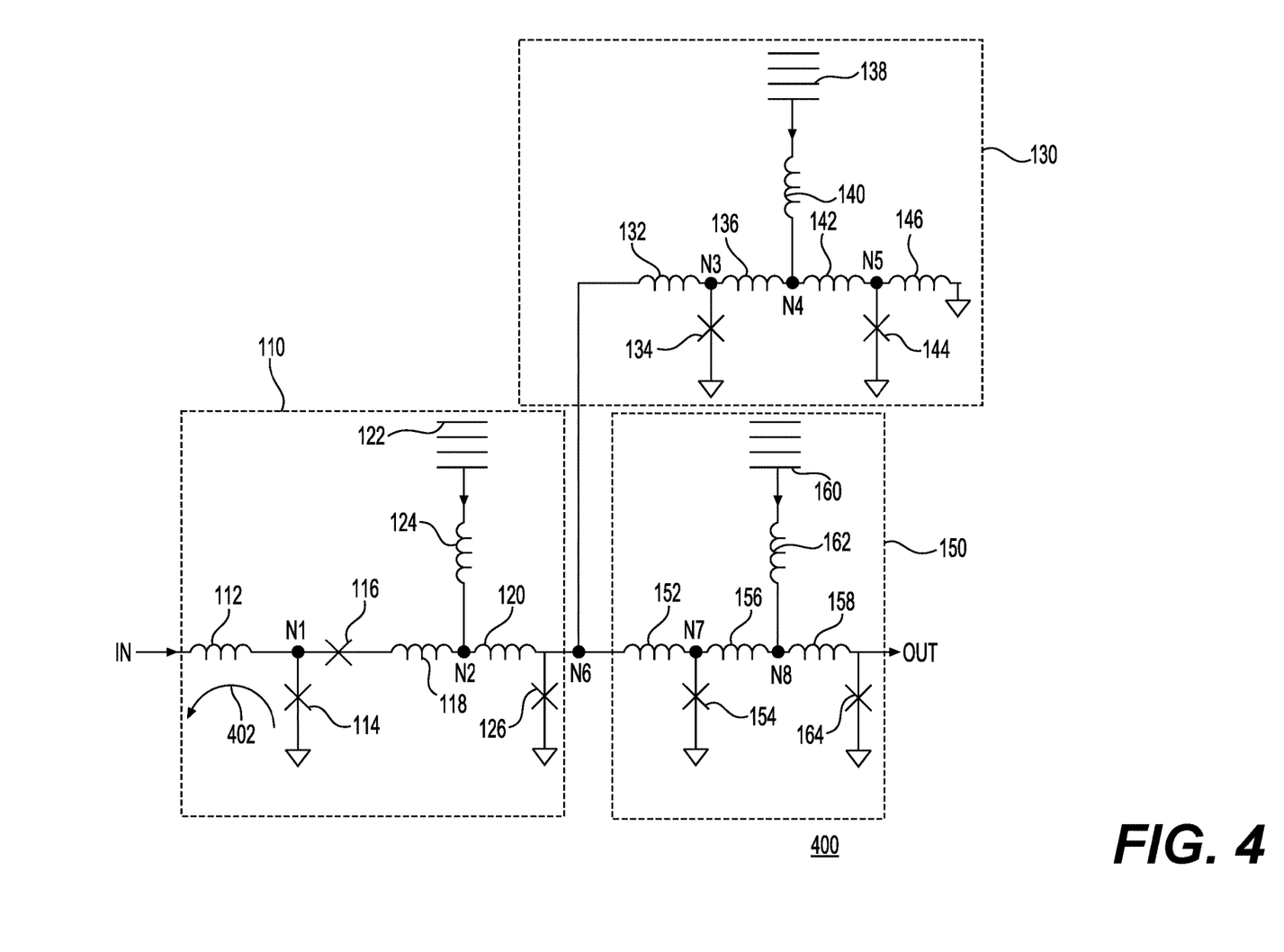
FIG. 4 is a diagram showing an operation state of the superconducting circuit of FIG. 1 in response to a negative pulse arriving at its input in accordance with one example.

FIG. 4 is a diagram showing an operation state 400 of superconducting circuit 100 of FIG. 1 in response to a negative pulse arriving at its input in accordance with one example. When the negative pulse (curve 402) arrives at the input terminal IN, it triggers both JJ 114 and JJ 116. In this example, the rightward traveling negative pulse is able to trigger JJ 116 because JJ 116 had already been triggered from the other side. The negative pulse is suppressed before reaching the output terminal OUT. JJ 116 triggers in response to a negative pulse at the input because it has already triggered in response to a leftward moving pulse. In triggering in response to this leftward moving pulse it has reversed the DC component of the bias it is receiving from bias terminal 122 causing the input signal and the DC component to be additive in the case of pulse represented by curve 402. This, in addition to input pulse represented by curve 402, is sufficient to trigger JJ 116 and prevent further propagation of the input negative pulse.

Figure 5:
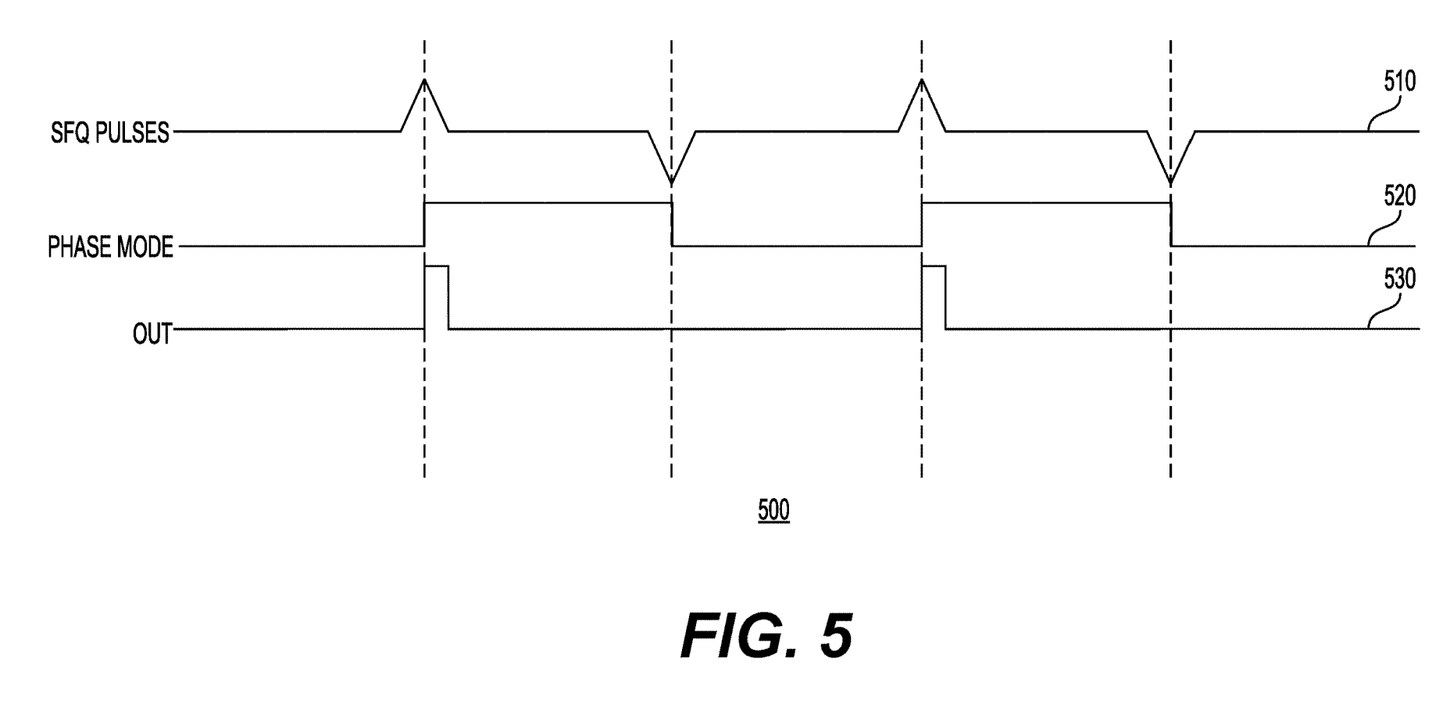
FIG. 5 shows waveforms associated with the superconducting circuit of FIG. 1 in accordance with one example.

FIG. 5 shows waveforms 500 associated with superconducting circuit 100 of FIG. 1 in accordance with one example. A waveform 510 including pulses (e.g., SFQ pulses) is received at the input terminal IN. The phase mode version of waveform 510 is shown as waveform 520. The phase mode version corresponds to the logical signal provided by superconducting logic preceding superconducting circuit 100. Waveform 530 is produced by superconducting circuit 100 at the output terminal OUT. As shown in FIG. 5, waveform 520 includes a return-to-zero pulse pair for each rising edge (e.g., corresponding to a positive SFQ pulse) at the input. Although FIG. 5 shows the logical input encoded using RQL, the logical input may be encoded using a different encoding method or logic.

Figure 6:
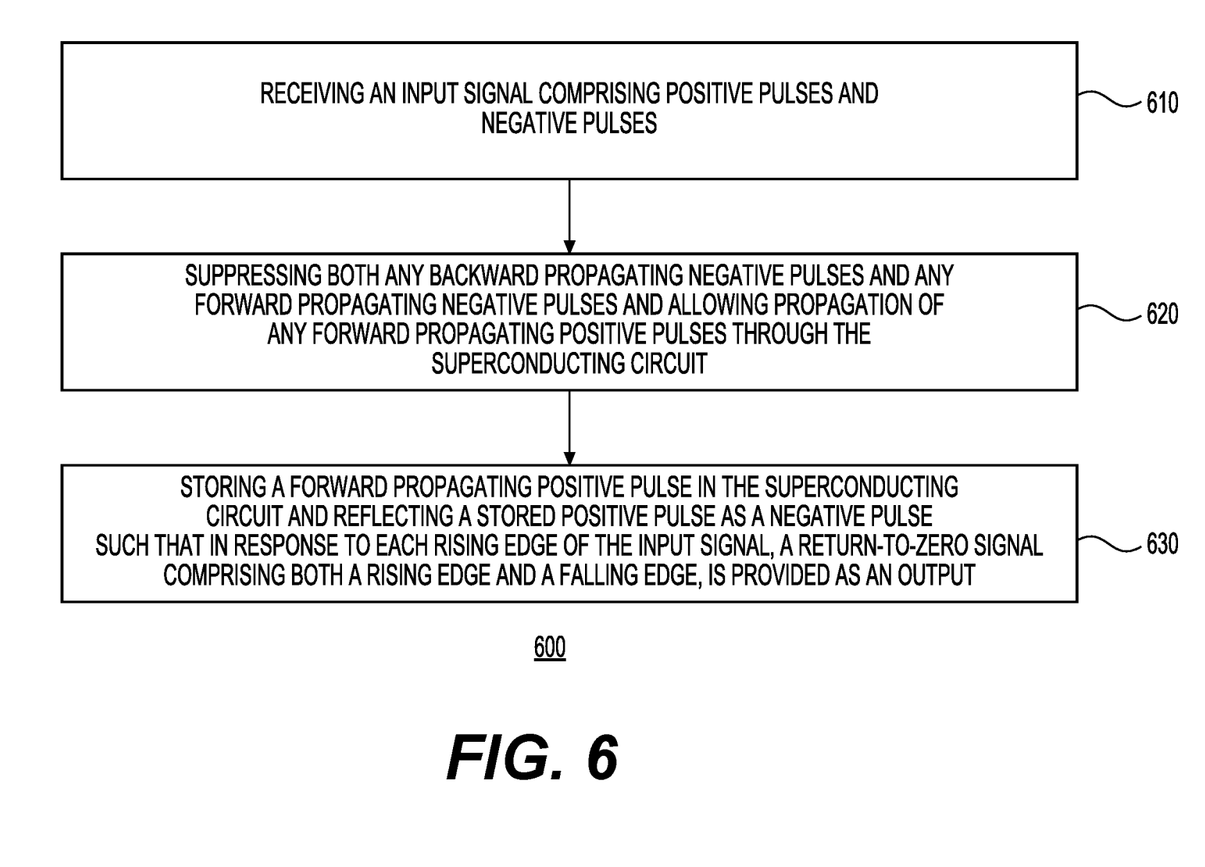
FIG. 6 is a flowchart of a method for converting an input signal into a return-to-zero signal using the superconducting circuit of FIG. 1 in accordance with one example.

FIG. 6 is a flowchart 600 of a method for converting an input signal into a return-to-zero signal using superconducting circuit 100 of FIG. 1 in accordance with one example.

Step 610 may include superconducting circuit 100 receiving an input signal comprising positive pulses and negative pulses via the input terminal IN. Waveform 510 of FIG. 5 corresponds to one example of such a non-return-to-zero signal.

Step 620 may include suppressing both any backward propagating negative pulses and any forward propagating negative pulses and allowing propagation of any forward propagating positive pulses through the superconducting circuit. In one example, this step may be performed by stage 110 of superconducting circuit 100 as described earlier with respect to FIGS. 1-4.

Step 630 may include storing a forward propagating positive pulse in the superconducting circuit and reflecting a stored positive pulse as a negative pulse such that that in response to each rising edge of the input signal a return-to-zero signal comprising both a rising edge and a falling edge is provided as an output. In one example, this step may be performed by stage 130 of superconducting circuit 100 as described earlier with respect to FIGS. 1-4.

In conclusion, a superconducting circuit comprising an input terminal for receiving an input signal comprising both positive pulses and negative pulses is provided. The superconducting circuit may further include a first stage, coupled to the input terminal and a first node, configured to suppress both any backward propagating negative pulses and any forward propagating negative pulses, and allow propagation of any forward propagating positive pulses. The superconducting circuit may further include a second stage, coupled to the first node, configured to store a forward propagating positive pulse and reflect a stored positive pulse back to the first node as a negative pulse such that in response to each rising edge of the input signal a return-to-zero signal comprising both a rising edge and a falling edge is provided as an output at the first node.

The superconducting circuit may further include an output terminal, where a third stage is coupled between the first node and the output terminal. The third stage may be configured to amplify the return-to-zero signal.

The first stage may include first inductor coupled between the input terminal and a second node and a first Josephson junction coupled between the second node and a ground terminal. The first stage may further include a second Josephson junction coupled between the second node and a third node, and where the third node is coupled to a biasing terminal for the first Josephson junction. The second Josephson junction may be biased in an opposite direction from a direction of bias of the first Josephson junction for pulses arriving via the input terminal, and where the second Josephson junction may be biased in a same direction as the direction of the bias of the first Josephson junction for pulses arriving via the third node.

The second stage may further include a storage loop comprising a third Josephson junction and an inductor for storing the forward propagating positive pulse.

In another aspect, the present disclosure relates to a method of operating a superconducting circuit. The method may include receiving an input signal comprising positive pulses and negative pulses. The method may further include suppressing both any backward propagating negative pulses and any forward propagating negative pulses, and allowing propagation of any forward propagating positive pulses through the superconducting circuit. The method may further include storing a forward propagating positive pulse in the superconducting circuit and reflecting a stored positive pulse as a negative pulse such that that in response to each rising edge of the input signal a return-to-zero signal comprising both a rising edge and a falling edge is provided as an output at the first node.

The superconducting circuit may include first stage configured to receive the non-return-to-zero signal. The superconducting stage may further include a second stage coupled to the first stage and a third stage coupled to both the first stage and the second stage.

The first stage may include a first Josephson junction coupled between an input terminal configured to receive the non-return-to-zero signal and a ground terminal. The first stage may further include a second Josephson junction placed between the first Josephson junction and a biasing terminal for the first Josephson junction.

The second stage may include a storage loop comprising a third Josephson junction and an inductor for storing the forward propagating positive pulse. The third stage may include an inductor coupled to a ground terminal.

In yet another aspect, the present disclosure relates to a superconducting circuit comprising an input terminal for receiving an input signal comprising both positive pulses and negative pulses. The superconducting circuit may further include a first stage, coupled to the input terminal and a first node, configured to suppress both any backward propagating negative pulses and any forward propagating negative pulses, and allow propagation of any forward propagating positive pulses. The superconducting circuit may further include a second stage, coupled to the first node, configured to store a forward propagating positive pulse and reflect a stored positive pulse back to the second node as a negative pulse after a selected delay such that that in response to each rising edge of the input signal a return-to-zero signal comprising both a rising edge and a falling edge is provided at the first node. The superconducting circuit may further include a third stage, coupled to the first node and an output terminal, configured to amplify the return-to-zero signal and provide an amplified output signal at the output terminal.

The first stage may include a first inductor coupled between the input terminal and a second node and a first Josephson junction coupled between the second node and a ground terminal. The first stage may further include a second Josephson junction coupled between the second node and a third node, and where the third node is coupled to a biasing terminal for the first Josephson junction. The second Josephson junction may be biased in an opposite direction from a direction of bias of the first Josephson junction for pulses arriving via the input terminal, and where the second Josephson junction may be biased in a same direction as the direction of the bias of the first Josephson junction for pulses arriving via the third node.

The third stage may include an inductor coupled to the output terminal and a ground terminal. Alternatively, the third stage may include a first inductor coupled between the second node and a third node, a first Josephson junction coupled between the third node and a ground terminal, a second inductor coupled between the third node and a fourth node, a biasing terminal coupled to the fourth node, a third inductor coupled between the fourth node and the output terminal, and a second Josephson junction coupled between the output terminal and the ground terminal.

It is to be understood that the methods, modules, devices, systems, and components depicted herein are merely exemplary. Alternatively, or in addition, the functionally described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with the examples described in this disclosure can also include instructions stored in a non-transitory media. The term "non-transitory media" as used herein refers to any media storing data and/or instructions that cause a machine to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory, such as, DRAM, SRAM, a cache, or other such media. Non-transitory media is distinct from, but can be used in conjunction with transmission media. Transmission media is used for transferring data and/or instruction to or from a machine. Exemplary transmission media include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A superconducting circuit comprising:
an input terminal for receiving an input signal comprising both positive pulses and negative pulses;
a first stage, coupled to the input terminal and a first node, configured to suppress both any backward propagating negative pulses and any forward propagating negative pulses received via the input terminal, and allow propagation of any forward propagating positive pulses received via the input terminal; and
a second stage, coupled to the first node, configured to store a forward propagating positive pulse and reflect a stored positive pulse back to the first node as a negative pulse such that in response to each rising edge of a positive pulse associated with the input signal a signal comprising both a rising edge and a falling edge is provided as an output at the first node.

2. The superconducting circuit of claim 1 further comprising an output terminal, wherein a third stage is coupled between the first node and the output terminal.

3. The superconducting circuit of claim 2, wherein the third stage is configured to amplify the signal provided as the output at the first node.

4. The superconducting circuit of claim 1, wherein the first stage comprises a first inductor coupled between the input terminal and a second node and a first Josephson junction coupled between the second node and a ground terminal.

5. The superconducting circuit of claim 4, wherein the first stage further comprises a second Josephson junction coupled between the second node and a third node, and wherein the third node is coupled to a biasing terminal for the first Josephson junction.

6. The superconducting circuit of claim 5, wherein the second Josephson junction is biased in an opposite direction from a direction of bias of the first Josephson junction for pulses arriving via the input terminal, and wherein the second Josephson junction is biased in a same direction as the direction of the bias of the first Josephson junction for pulses arriving via the third node.

7. The superconducting circuit of claim 6, wherein the second stage comprises a storage loop comprising a third Josephson junction and an inductor for storing the forward propagating positive pulse.

8. A method of operating a superconducting circuit comprising:
receiving, via an input terminal of the superconducting circuit, an input signal comprising positive pulses and negative pulses;
suppressing both any backward propagating negative pulses and any forward propagating negative pulses received via the input terminal, and allowing propagation of any forward propagating positive pulses, received via the input terminal, through the superconducting circuit; and
storing a forward propagating positive pulse in the superconducting circuit and reflecting a stored positive pulse as a negative pulse such that that in response to each rising edge of a positive pulse associated with the input signal a return-to-zero signal comprising both a rising edge and a falling edge is provided as an output at the first node.

9. The method of claim 8, wherein the input signal comprises a non-return-to-zero signal, and wherein the superconducting circuit comprises a first stage configured to receive the non-return-to-zero signal.

10. The method of claim 9, wherein the superconducting circuit further comprises a second stage coupled to the first stage and a third stage coupled to both the first stage and the second stage.

11. The method of claim 10, wherein the first stage comprises a first Josephson junction coupled between an input terminal configured to receive the non-return-to-zero signal and a ground terminal.

12. The method of claim 11, wherein the first stage further comprises a second Josephson junction placed between the first Josephson junction and a biasing terminal for the first Josephson junction.

13. The method of claim 10, wherein the second stage comprises a storage loop comprising a third Josephson junction and an inductor for storing the forward propagating positive pulse.

14. The method of claim 10, wherein the third stage comprises an inductor coupled to a ground terminal.

15. A superconducting circuit comprising:
an input terminal for receiving an input signal comprising both positive pulses and negative pulses;
a first stage, coupled to the input terminal and a first node, configured to suppress both any backward propagating negative pulses and any forward propagating negative pulses received via the input terminal, and allow propagation of any forward propagating positive pulses received via the input terminal;
a second stage, coupled to the first node, configured to store a forward propagating positive pulse and reflect a stored positive pulse back to the second node as a negative pulse after a selected delay such that that in response to each rising edge of a positive pulse associated with the input signal a return-to-zero signal comprising both a rising edge and a falling edge is provided at the first node; and
a third stage, coupled to the first node and an output terminal, configured to amplify the return-to-zero signal and provide an amplified output signal at the output terminal.

16. The superconducting circuit of claim 15, wherein the first stage comprises a first inductor coupled between the input terminal and a second node and a first Josephson junction coupled between the second node and a ground terminal.

17. The superconducting circuit of claim 16, wherein the first stage further comprises a second Josephson junction coupled between the second node and a third node, and wherein the third node is coupled to a biasing terminal for the first Josephson junction.

18. The superconducting circuit of claim 17, wherein the second Josephson junction is biased in an opposite direction from a direction of bias of the first Josephson junction for pulses arriving via the input terminal, and wherein the second Josephson junction is biased in a same direction as the direction of the bias of the first Josephson junction for pulses arriving via the third node.

19. The superconducting circuit of claim 15, wherein the third stage comprises an inductor coupled to the output terminal and a ground terminal.

20. The superconducting circuit of claim 15, wherein the third stage comprises a first inductor coupled between the second node and a third node, a first Josephson junction coupled between the third node and a ground terminal, a second inductor coupled between the third node and a fourth node, a biasing terminal coupled to the fourth node, a third inductor coupled between the fourth node and the output terminal, and a second Josephson junction coupled between the output terminal and the ground terminal.

* * * * *